United States Patent
Lin et al.

(10) Patent No.: US 7,254,086 B2
(45) Date of Patent: Aug. 7, 2007

(54) METHOD FOR ACCESSING MEMORY

(75) Inventors: Ching-Yuan Lin, Hsin-Chu Hsien (TW); Hong-Yi Liao, Yun-Lin Hsien (TW); Yen-Tai Lin, Hsin-Chu (TW); Shih-Yun Lin, Tai-Nan (TW); Chun-Hung Lu, Yun-Lin County (TW)

(73) Assignee: eMemory Technology Inc., Hsin-Chu (TW)

( * ) Notice: Subject to any disclaimer, the term of this patent is extended or adjusted under 35 U.S.C. 154(b) by 178 days.

(21) Appl. No.: 11/163,431

(22) Filed: Oct. 19, 2005

(65) Prior Publication Data

US 2006/0262626 A1 Nov. 23, 2006

Related U.S. Application Data

(60) Provisional application No. 60/594,922, filed on May 19, 2005.

(51) Int. Cl.
*G11C 8/00* (2006.01)
(52) U.S. Cl. .......................... 365/230.03; 365/185.01; 365/185.04; 365/185.09; 365/185.11; 365/185.33
(58) Field of Classification Search .......... 365/185.01, 365/185.04, 185.09, 185.11, 185.33, 230.03
See application file for complete search history.

(56) References Cited

U.S. PATENT DOCUMENTS

| | | | | |
|---|---|---|---|---|
| 5,675,547 A | * | 10/1997 | Koga | .................... 365/230.03 |
| 6,208,549 B1 | * | 3/2001 | Rao et al. | ...................... 365/96 |
| 6,222,760 B1 | | 4/2001 | Chang | |
| 6,584,018 B2 | * | 6/2003 | Tuan et al. | ............ 365/185.28 |
| 6,728,137 B1 | | 4/2004 | Lin | |
| 6,857,054 B2 | * | 2/2005 | Minne | ........................ 711/163 |
| 7,180,764 B2 | * | 2/2007 | Kim et al. | ..................... 365/94 |
| 2006/0285385 A1 | * | 12/2006 | Kuo | ....................... 365/185.04 |

FOREIGN PATENT DOCUMENTS

EP    0 526 221 A1    2/1993

* cited by examiner

*Primary Examiner*—Richard T. Elms
*Assistant Examiner*—Eric Wendler
(74) *Attorney, Agent, or Firm*—Winston Hsu

(57) ABSTRACT

The present invention provides a method for accessing a memory. The memory contains M one-time programmable memory blocks, and each has a first memory sector and a second memory sector. The method includes: selecting a first target memory block and reading the first target memory block. The step of selecting a first target memory block is performed by comparing the second memory sectors of N one-time programmable memory blocks from M one-time programmable memory blocks by following a search rule to select the first target memory block.

13 Claims, 10 Drawing Sheets

METHOD FOR ACCESSING MEMORY

CROSS REFERENCE TO RELATED APPLICATIONS

This application claims the benefit of U.S. Provisional Application No. 60/594,922, filed on May 19, 2005 and entitled "REPROGRAMMABLE OTP", the contents of which are incorporated herein by reference.

BACKGROUND OF THE INVENTION

1. Field of the Invention

The present invention relates to a method for accessing a memory, especially to a method for accessing a one time programmable (OTP) memory.

2. Description of the Prior Art

Recently, non-volatile memories are widely adopted in all kinds of electronic products such as cell phones, digital cameras, and digital music players. These non-volatile memories are usually hard drives, flash memories, and OTP memories. Flash memories and OTP memories are two common types of memories. The major difference between these two kinds of memories is that a flash memory is refreshable while an OTP memory can only be written once. More specifically, a flash memory is capable of being read and written many times, but once an OTP memory is programmed, i.e., when some data are written into an OTP memory, the OTP memory can no longer be utilized to store another data.

A flash memory is a multi-time programmable (MTP) memory which is capable of being repeatedly written and erased, and therefore a flash memory requires some circuits that perform the erase, write, and read operations. However, an OTP memory requires only write and read operations but no erase operation; therefore, compared to an MTP memory, an OTP memory does not require a circuit to perform the erase operation. The simplicity of an OTP memory leads to a simpler and low-cost manufacturing process of the circuit of the OTP memory. Under a circumstance where only a few read and write processes are required, a plurality of OTP memories is often utilized to simulate an MTP memory. As a result, the performance of a MTP memory can be achieved without an additional erase circuit.

U.S. Pat. No. 6,728,137 discloses a method for performing the read and write operations on an OTP memory. A plurality of OTP memories is utilized to simulate an MTP memory. Please refer to FIG. 1. FIG. 1 shows a circuit configuration of a memory device. The memory device 100 contains an OTP memory area 110, a control circuit 120, a row decoder 130, a column decoder 140, and a record element 150. The OTP memory area 110 contains N OTP memory blocks 112, and every OTP memory block 112 contains a plurality of memory cells (not shown). Each memory cell stores a data of one bit. Since every memory cell is one time programmable, programmed memory cells cannot be written into new data, i.e., cannot be programmed again. The record element 150 consists of a plurality of record units 152, each of which contains one or more than one memory cell(s). Every record unit 152, which corresponds respectively to an OTP memory block 112, stores the usage status of its corresponding OTP memory block 112. For example, the record unit A stores the usage status of the OTP memory block #1, the record unit B stores the usage status of the OTP memory block #2, and so on. According to the embodiment disclosed in this patent, if some record unit 152 stores a data of "0", the OTP memory block 112 corresponding to this record unit 152 is an un-programmed OTP memory block; however, if some record unit 152 stores a data of "1", the OTP memory block 112 corresponding to this record unit 152 is a programmed OTP memory block. Please note that the minimum units of the OTP memory area 110 and the record element 150 are memory cells such that the same manufacturing method can be applied on both the OTP memory area 110 and the record element 150.

The control circuit 120, which is coupled to the record element 150, the row decoder 130, and the column decoder 140, outputs a control signal according to the data stored in the record element 150. After being decoded by the row decoder 130 and the column decoder 140, the control signal selects a proper OTP memory block 112 for being programmed or being read. Although the OTP memory blocks 112 contained in the OTP memory area 110 can only be programmed once and the stored data cannot be replaced by a new data, an MTP memory is able to be simulated by utilizing a plurality of OTP memory blocks 112 along with a proper control method.

The patent mentioned above discloses a method that utilizes a record element 150 outside the OTP memory area 110 to record the usage status of every OTP memory block 112. The control circuit 120 selects a proper OTP memory block 112 to program or read by reading the data stored in the record element 150.

SUMMARY OF THE INVENTION

Therefore, it is an object of the claimed invention to provide a method for accessing a memory. In this method, no additional record units are required to record the usage status of any memory block.

According to an embodiment of the claimed invention, a method for accessing a memory device is disclosed. The memory device comprises at least one OTP memory block, and each memory block comprises a first memory section and a second memory section. The method comprises: selecting a first target memory block; reading the first target memory block; and if the first memory section of the first target memory block stores a first data, a predetermined value is outputted as the value stored in the first target memory block, and if the first memory section of the first target memory block stores a second data, the value stored in the second memory section of the first target memory block is outputted as the value stored in the first target memory block.

According to an embodiment of the claimed invention, a method for accessing a memory device is disclosed. The memory device comprises at least one OTP memory block. Each memory block comprises a first memory section and a second memory section, and before an OTP memory block is programmed, each memory cell of the OTP memory block stores a first logic value. The method comprising: selecting a first target memory block; and programming the second memory section of the first target memory block such that the second memory section stores a predetermined value to erase the first target memory block.

According to an embodiment of the claimed invention, a method for accessing a memory device is disclosed. The memory device comprises at least one OTP memory block. Each memory block comprises a first memory section and a second memory section, and before an OTP memory block is programmed, each memory cell of the OTP memory block stores a first logic value. The method comprising: selecting a target memory block; and writing a to-be-written data to the target memory block, wherein if the to-be-written data corresponds to a predetermined value, program only the first memory section of the target memory block to store a first data, and if the to-be-written data does not correspond to the predetermined value, program the second memory section of the target memory block according to the to-be-written data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
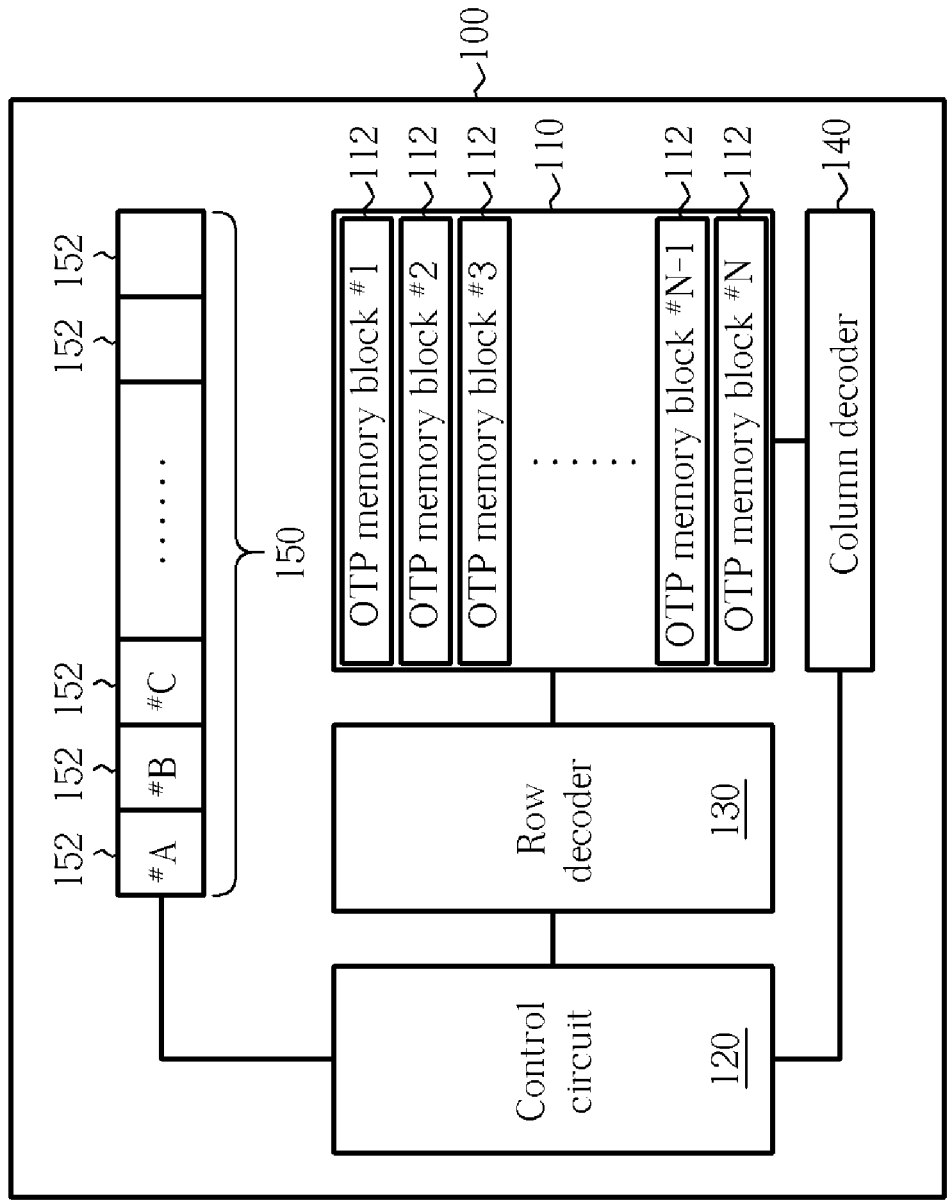
FIG. 1 shows a circuit configuration of a prior art memory device.
Figure 2:
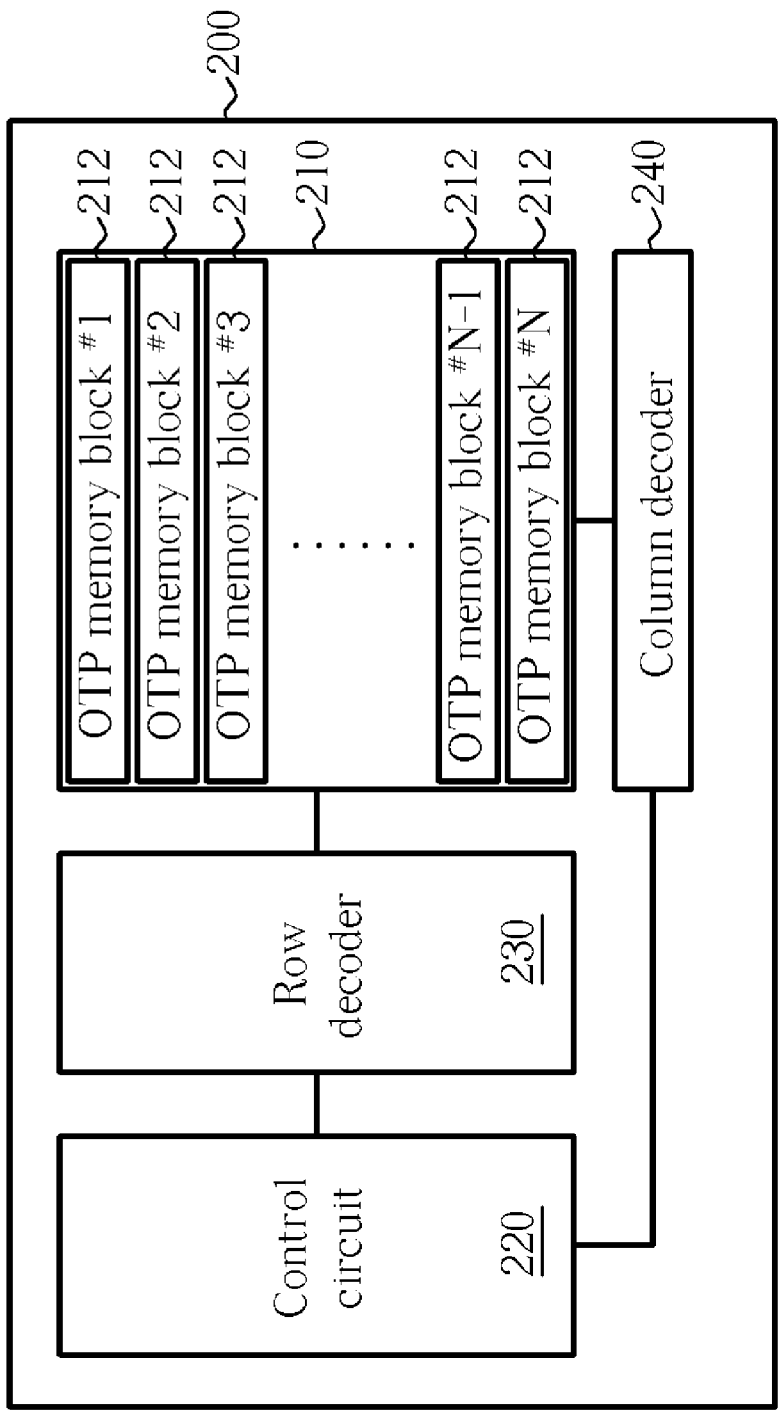
FIG. 2 shows a circuit configuration of a memory device according to the present invention.
Figure 3:
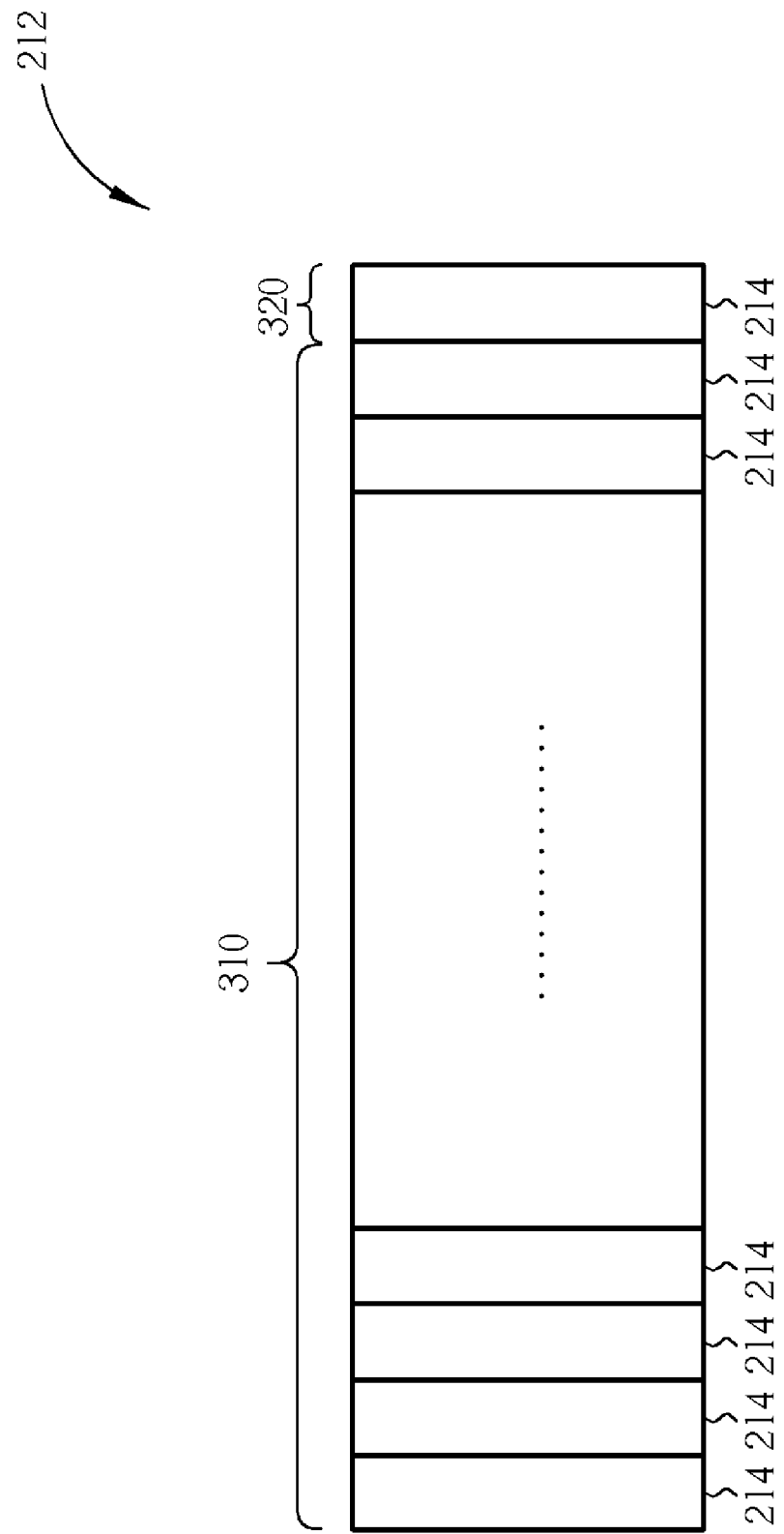
FIG. 3 shows the inner circuit configuration of the OTP memory block shown in FIG. 2.

Please refer to FIG. 2. FIG. 2 shows a preferred embodiment of the present invention. The memory device 200 shown in FIG. 2 contains an OTP memory area 210, a control circuit 220, a row decoder 230, and a column decoder 240. The OTP memory area 210 contains a plurality of OTP memory blocks 212. Please refer to FIG. 3. FIG. 3 shows the inner circuit configuration of the OTP memory block 212. Each OTP memory block 212 consists of a plurality of memory cells 214. Like the memory cells of the prior art memory device 100, each memory cell 214 stores a data of 1 bit. In this embodiment, the plurality of memory cells 214 can be divided into two sections, i.e., every OTP memory block contains a first memory section 320 and a second memory section 310. Each memory section contains one or more than one memory cell(s). In this embodiment, the first memory section 320 contains the last memory cell 214 of the OTP memory block 212, and the second memory section 310 contains all other memory cells 214 except it does not contain the last memory cell 214.

Please refer to FIG. 2. The control circuit 220 determines how to select a proper OTP memory block 212, and controls how to write or read every memory cell 214 in the OPT memory block 212. The control signal outputted by the control circuit 220 is first decoded by the row decoder 230 and the column decoder 240, and then a specific OTP memory block 212 can be selected by the control circuit 220 according to the decoded control signal. Consequently, the control circuit 220 writes or reads the memory cells 214 of the selected OTP memory block 212.

Figure 4:
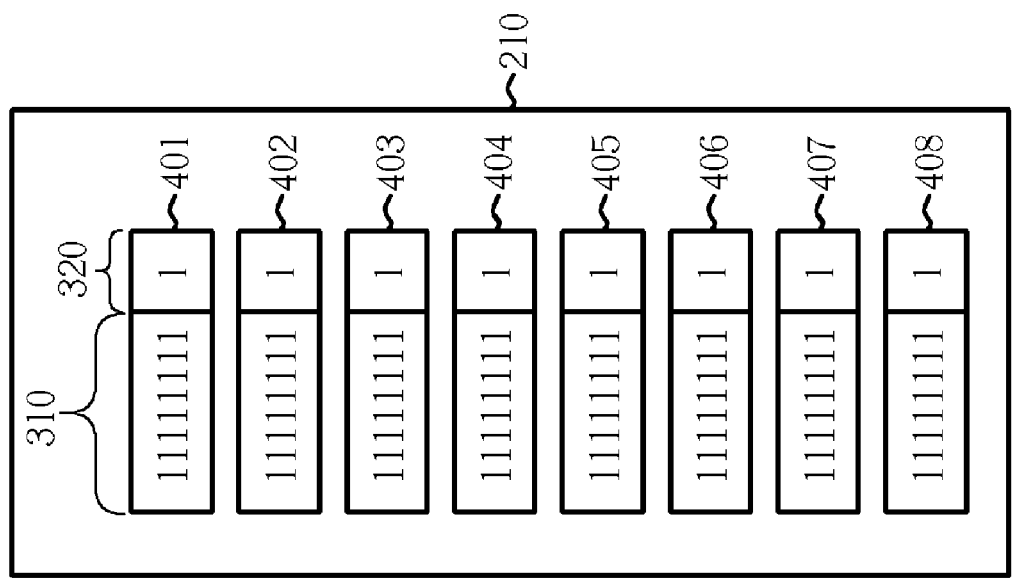
FIG. 4 shows a first status of the memory device shown in FIG. 2.
Figure 5:
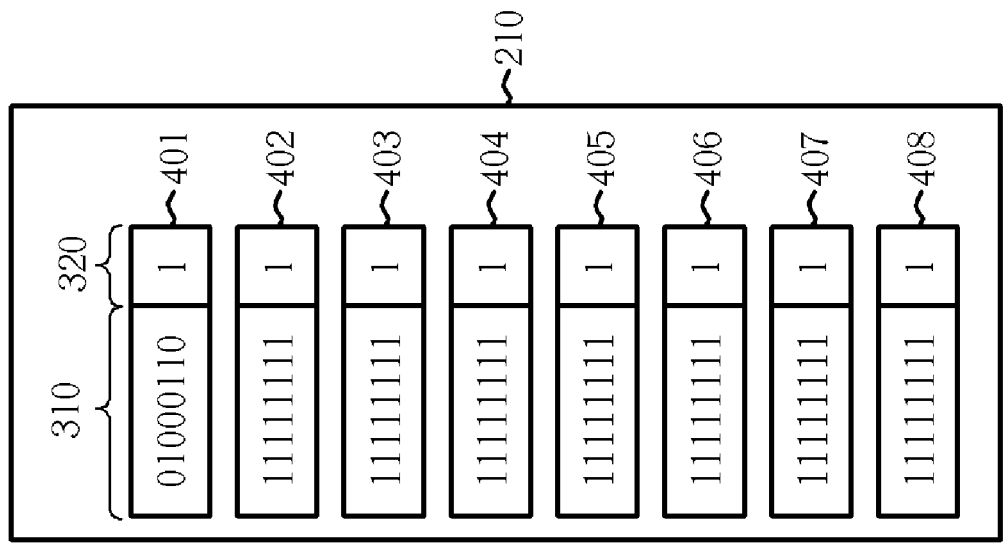
FIG. 5 shows a second status of the memory device shown in FIG. 2.
Figure 6:
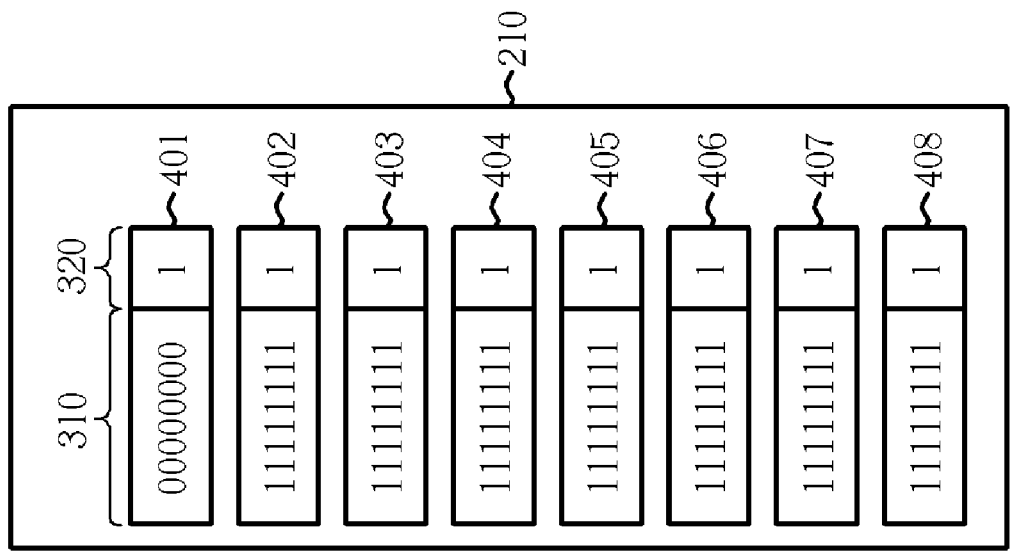
FIG. 6 shows a third status of the memory device shown in FIG. 2.

The following is a description of a method of accessing a specific memory block 212. Please note that every memory cell 214 of the OTP memory block 212 has a logic value status (e.g., logic value "1") when the memory cell 214 is un-programmed, and has a different logic value status (e.g., logic value "0") when the memory cell 214 is programmed. Please refer to FIG. 4. FIG. 4 is an inner circuit of the OTP memory area 210 shown in FIG. 2. In the following embodiment, eight OTP memory blocks 212, which are re-named 401~408, are taken as an example to illustrate the steps of accessing the memory blocks 401~408. However, the number of OTP memory blocks shown in this example is not meant to be a limitation of the present invention. In this example, it is given that memory blocks 401~408 each contain 9 memory cells 214, and these 9 memory cells 214 are divided into two sections, i.e., the first memory section 320 and the second memory section 310. The second memory section 310 contains 8 memory cells capable of storing a data of 8 bits, and the first memory section 320 contains the remaining memory cell capable of storing a data of 1 bit. Before the OTP memory area 210 is programmed, all memory cells 214 of the OTP memory blocks 401~408 have the same logic value of "1". The sequence of utilizing the OTP memory blocks 401~408 proceeds from top to bottom, i.e., the first OTP memory block to be utilized is the memory block 401, the second memory block to be utilized is the memory block 402, and so on. The memory block 401 is selected for the first writing process. Assuming that the value to be written is 70, hence the data "01000110" corresponding to the value 70 is written into the OTP memory block 401. The updated status of the OTP memory area 210 is shown in FIG. 5. When reading, the control circuit 220 initially reads every second memory section 310 of every OTP memory block 212 in the OTP memory area 210, and determines the first OTP memory block whose second memory section 310 does not store the logic value representing an erased OTP memory block. In this case, it is OTP memory block 401 that is the first OTP memory block whose second memory section 310 does not store the logic value representing an erased OTP memory block. Therefore, when next reading the OTP memory area 210, the control circuit 220 selects the OTP memory block 401. The data stored in the first memory section 320 is first checked. Because the present data stored in the first memory section 320 is "1", the data stored in the second memory section 310 is then read. As a result, a value of 70 is outputted according to the read data "01000110". When it is required to further write data in the OTP memory area 210, an operation of "erase" is required to be performed on the presently utilized OTP memory block 401. For an OTP memory block, there is not actually an erase operation. In the present invention, an OTP memory block is identified as being erased by storing a predetermined data in the second memory section 310. For example, assuming that the predetermined data is a data whose highest two bits are "0" (e.g., "00xxxxxx"), such as "00111111", which corresponds to a value of 63, then whenever the status of the second memory section 310 is "00111111", the corresponding OTP memory block is identified as being an erased memory block. However, when the value to be stored in an OTP memory block happens to correspond to the data whose highest two bits are "0" (e.g., "00xxxxxx"), such as "00111111", then the status of the second memory section 310 is left as "11111111", and the data stored in the first memory section 320 is changed from "1" to "0" for identifying that the present value stored in the OTP memory block is 63, which corresponds to the predetermined data "00111111". When selecting an OTP memory block to be accessed, the control circuit 220 manages to determine the first OTP memory block having a second memory section 310 whose two highest bits are not "0". In this embodiment, the predetermined data is set to be all 0 (i.e., "00000000"), which means when the data stored in the first memory section 320 is "0", the value stored in the corresponding OTP memory block is zero. In short, in this embodiment, the OTP memory block 401 is identified as being erased by changing the logic values of all the memory cells of the second memory section 310 to 0. The erased status is shown in FIG. 6. All the memory cells of the second memory section 310 of the OTP memory block 401 store the same logic value 0. After the erase operation is completed, it's allowable to write a second value to the next OTP memory block.

Figure 7:
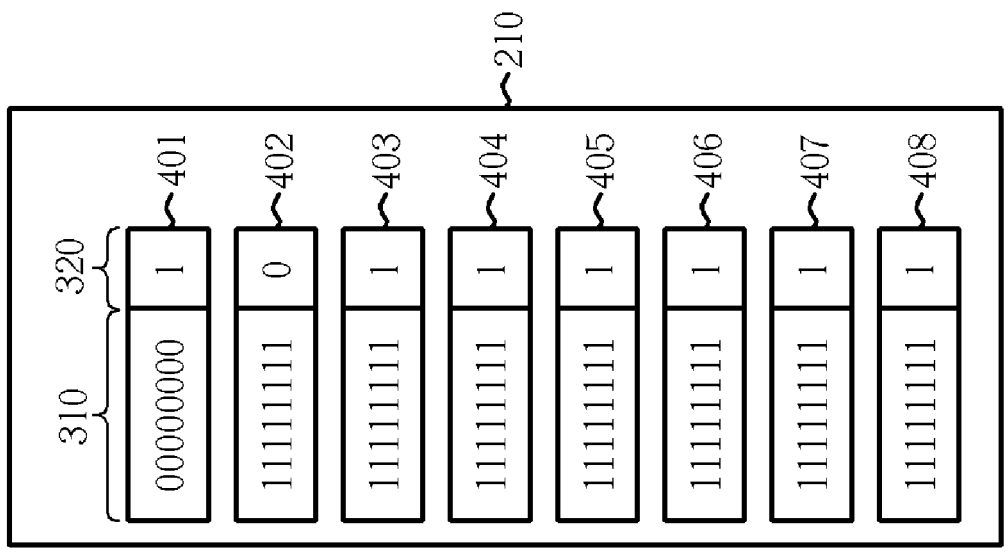
FIG. 7 shows a fourth status of the memory device shown in FIG. 2.

Before the process of writing a second value to an OTP memory block, the logic values of all the memory cells of the second memory section 310 of the OTP memory block must be 1. An OTP memory block having all memory cells of logic value 1 is an un-programmed OTP memory block. There may be several un-programmed OTP memory blocks at the same time, but only the first un-programmed OTP memory block will be selected for having data written to it since the sequence of utilizing the OTP memory blocks in the OTP memory area 210 proceeds from top to bottom. For this present embodiment, the OTP memory block 402 is selected to be written into the second data. Here the section value is set to be zero, which correspond to a data of "00000000". If the memory cells of the second memory section 310 of the OTP memory block 402 are all programmed to be 0, the OTP memory block 402 will be considered as an erased OTP memory block. Therefore, when the data to be written is zero, the first memory section 320 is programmed instead of the second memory section 310. The memory cell of the first memory section 320 is programmed to be a logic value 0, which represents that the value stored in the OTP memory block 402 is zero. FIG. 7 shows the status after the second value is written.

Before the next reading process, an OTP memory block is selected by comparing every second memory section 310 of each OTP memory block. The status of the second memory section 310 of the selected OTP memory block is not "00000000". The OTP memory blocks above the selected OTP memory block are all erased, i.e., the second memory sections 310 thereof have the same status of "00000000", and the OTP memory blocks under the selected OTP memory block are all un-programmed, i.e., statuses of the first memory section 320 and the second memory section 310 are respectively "1" and "11111111". Therefore, in this embodiment, the OTP memory block 402 is selected. In the reading process, the data stored in the first memory section 320 is first read. Since the data stored in the first memory section 320 is 0, i.e., the value stored in the OTP memory block 402 is zero, a value of 0 is obtained in the reading process.

Figure 8:
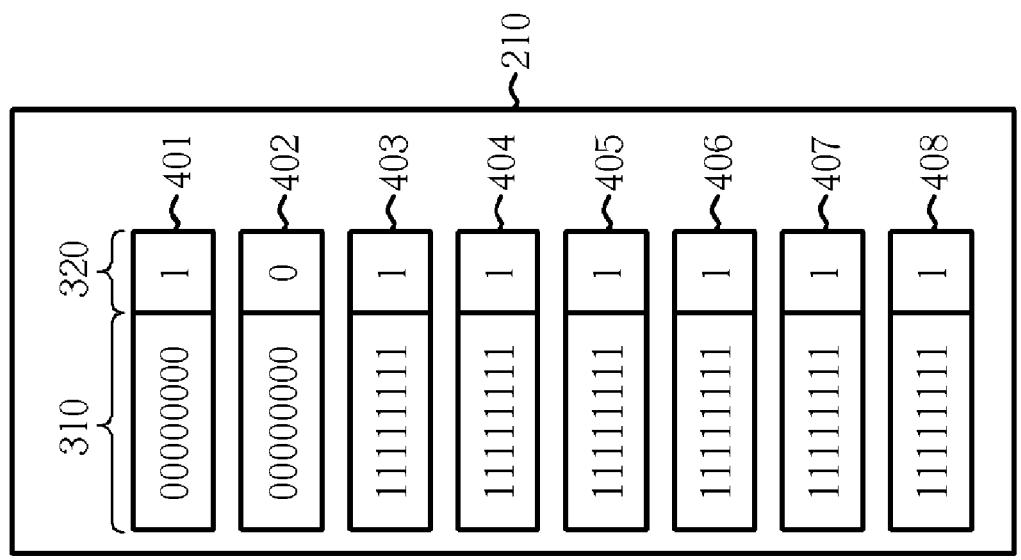
FIG. 8 shows a fifth status of the memory device shown in FIG. 2.

Next, in the erase process, an OTP memory block is selected by comparing every second memory section 310 of each OTP memory block. The status of the second memory section 310 of the selected OTP memory block is not "00000000". The OTP memory blocks above the selected OTP memory block are all erased, i.e., the second memory sections 310 thereof have the same status of "00000000", and the OTP memory blocks under the selected OTP memory block are all un-programmed, i.e., statuses of the first memory section 320 and the second memory section 310 are respectively "1" and "11111111". Therefore, in this embodiment, the OTP memory block 402 is selected. When the OTP memory block 402 is erased, the status of the second memory section 310 is programmed to be "00000000", as shown in FIG. 8.

The above-mentioned writing, reading and erasing processes can be repeated until all the OTP memory blocks in the OTP memory area 210 are programmed.

Figure 9:
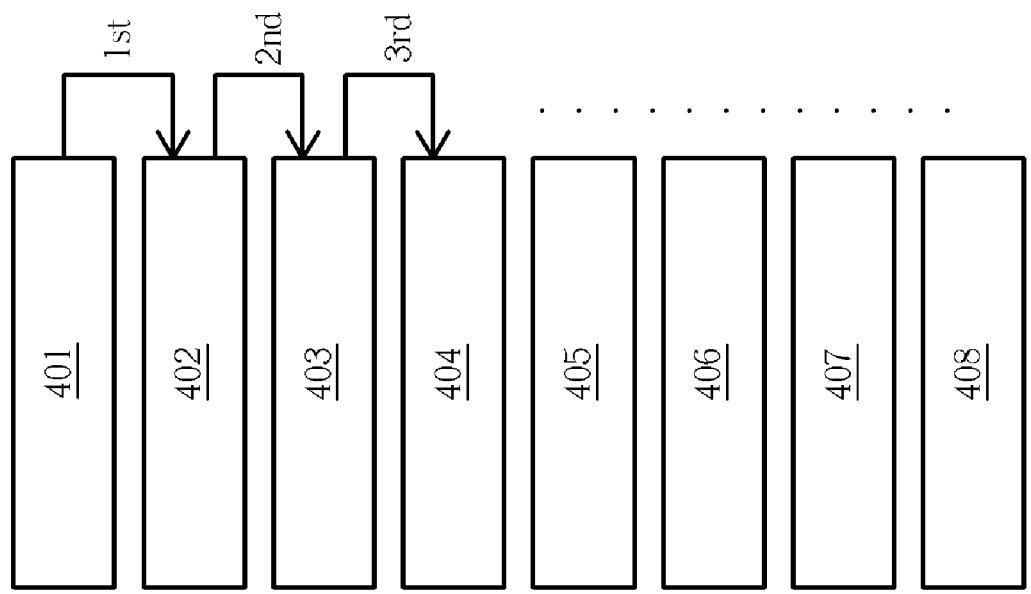
FIG. 9 is a diagram illustrating the sequential search.

In the present invention, two major searching rules are adopted to perform the selection of the proper OTP memory block. These two searching rules serve as exemplary examples to illustrate the searching procedure, but are not meant to a limitation of the present invention. The first searching rule is a sequential search. Please refer to FIG. 9. Here, the exemplary example also utilizes 8 OTP memory blocks to illustrate the searching procedure. During the reading, erasing or writing process, the control circuit 220 checks if the status of the second memory section 310 of the OTP memory block 401 is all 0 (i.e., "00000000"). If it is true, then the control circuit 220 checks the next OTP memory block, i.e., the OTP memory block 402. The control circuit 220 checks all the OTP memory blocks in sequence until it finds the first OTP memory block having a second memory section 310 whose status is not all 0 (i.e., "00000000") The OTP memory block is the selected OTP memory block. If the initial status of the second memory section 310 of the selected memory block is not all 1 (i.e., "11111111"), i.e., the selected memory block is programmed, then the to-be-written data of the present writing process along with the previously written data will form a joint data. For example, if the previously written data is "10111111" and the to-be-written data is "11110010", then the status of the second memory section 310 of the selected OTP memory block will be "10110010" after the present writing process is completed. In short, even if the initial statuses of the second memory section 310 and the first memory section 320 are not all 1, the writing process can still be performed. However, the written data may not be read out correctly.

Figure 10:
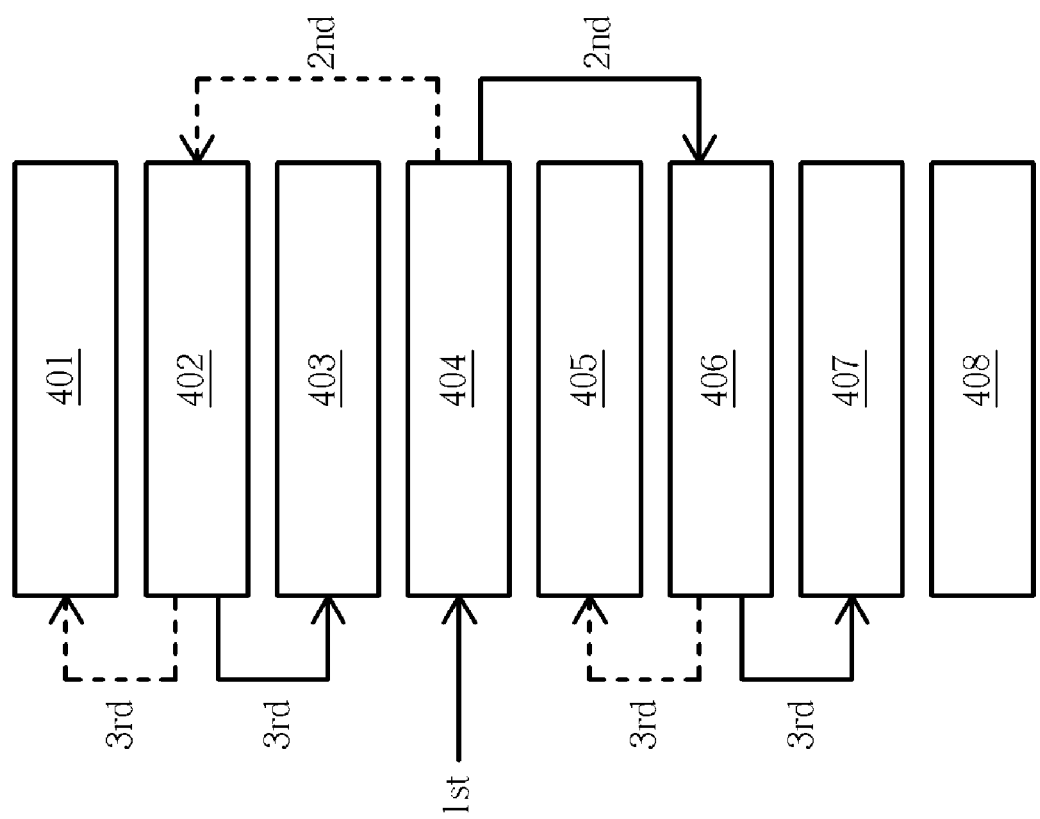
FIG. 10 is a diagram illustrating the binary search.

The second searching rule is a binary search. Please refer to FIG. 10. When performing the first search procedure, the control circuit 220 initially checks the middle OTP memory block of all the OTP memory blocks. Therefore, in this embodiment, the control circuit 220 first checks the OTP memory block 404. During the reading, erasing, or writing process, the control circuit 220 checks the status of the second memory section 310 of the OTP memory block 404. A status of the second memory section 310 of the OTP memory block 404 being all 0 (i.e., "00000000") means that the OTP memory blocks 401~404 are all erased. In this case, the control circuit 220 follows the direction of the solid line to perform the second check on the OTP memory block 406. However, if the status of the second memory section 310 of the OTP memory block 404 is not all 0 (i.e., not "00000000") and not all 1 (i.e., not "11111111"), then the control circuit 220 selects the OTP memory block 404. If the status of the second memory section 310 of the OTP memory block 404 is all 1 (i.e., "11111111"), the control circuit 220 further checks the status of the first memory section 320 of the OTP memory block 404. A status of the first memory section 320 of the OTP memory block 404 being 0 means that the OTP memory block 404 already stores a value of 0. As a result, the control circuit 220 determines the OTP memory block 404 as the present selected OTP memory block. However, a status of 1 means that all the OTP memory blocks under the OTP memory block 404 are un-programmed. If the status of the first memory section 320 of the OTP memory block 404 is "1", the control circuit 220 follows the direction of the dotted line to perform the second check on the OTP memory block 402.

However, regardless of performing the second check on the OTP memory block 402 or 406, the above-mentioned rule is repeated until the first OTP memory block having a second memory section 310 whose status is not all 0 is found. This OTP memory block is the present selected OTP memory block. Similarly, if the initial status of the second memory section 310 of the selected OTP memory block is not all 1 (i.e., not "11111111"), i.e., the selected OTP memory block is programmed, then the to-be-written data of the present writing process along with the previously written data will form a joint data. For example, if the previously written data is "10111111" and the to-be-written data is "11110010", then the status of the second memory section 310 of the selected OTP memory block will be "10110010" after the present writing process is completed. In short, even if the initial statuses of the second memory section 310 and the first memory section 320 are not all 1, the writing process can still be performed. However, the written data may not be read out correctly.

In summary, either sequential search or binary search primarily checks the status of the second memory section 310 of the OTP memory block. A proper OTP memory block is selected by comparing the statuses of the second memory sections 310 of the OTP memory blocks, and then the reading, erasing, or writing process is performed on the selected OTP memory block. In short, in the present invention, by dividing an OTP memory block into two memory sections (i.e., the first memory section 320 and the second memory section 310), the memory device does not require additional record units to record the usage status (e.g., un-programmed or programmed) of each OTP memory block. A proper OTP memory block can be selected by merely performing a compare procedure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a memory device, the memory device comprising at least one one-time-programmable (OTP) memory block, and each memory block comprising a first memory section and a second memory section, the method comprising:
   selecting a first target memory block;
   reading the first target memory block; and
   if the first memory section of the first target memory block stores a first data, a predetermined value is outputted as the value stored in the first target memory block, and if the first memory section of the first target memory block stores a second data, the value stored in the second memory section of the first target memory block is outputted as the value stored in the first target memory block.

2. The method of claim 1, wherein before an OTP memory block is programmed, each memory cell of the OTP memory block stores a first logic value, and the method further comprises:
   programming the second memory section of the first target memory block such that the second memory section stores the predetermined value to erase the first target memory block.

3. The method of claim 1, wherein the memory device comprises M OTP memory blocks, and the step of selecting the first target memory block further comprises:
   comparing the second memory sections of N OTP memory blocks from the M OTP memory blocks according to a search rule to select the first target memory block.

4. The method of claim 2, wherein the memory device comprises a plurality of OTP memory blocks arranged in sequence, and the method further comprises:
   writing a to-be-written data to a second target memory block that is after the first target memory block, wherein if the to-be-written data corresponds to the predetermined value, program only the first memory section of the second target memory block to store the first data, and if the to-be-written data does not correspond to the predetermined value, program the second memory section of the second target memory block according to the to-be-written data.

5. The method of claim 3, wherein the search rule is a sequential search or a binary search.

6. A method for accessing a memory device, the memory device comprising at least one one-time-programmable (OTP) memory block, each memory block comprising a first memory section and a second memory section, and before an OTP memory block is programmed, each memory cell of the OTP memory block storing a first logic value, the method comprising:
   selecting a first target memory block; and
   programming the second memory section of the first target memory block such that the second memory section stores a predetermined value to erase the first target memory block.

7. The method of claim 6, wherein the memory device comprises a plurality of OTP memory blocks arranged in sequence, and the method further comprises:
   writing a to-be-written data to a second target memory block that is after the first target memory block, wherein if the to-be-written data corresponds to the predetermined value, program only the first memory section of the second target memory block to store a first data, and if the to-be-written data does not correspond to the predetermined value, program the second memory section of the second target memory block according to the to-be-written data.

8. The method of claim 6, wherein the memory device comprises M OTP memory blocks, and the step of selecting the first target memory block further comprises:
   comparing the second memory sections of N OTP memory blocks from the M OTP memory blocks according to a search rule to select the first target memory block.

9. The method of claim 8, wherein the search rule is a sequential search or a binary search.

10. A method for accessing a memory device, the memory device comprising at least one one-time-programmable (OTP) memory block, each memory block comprising a first memory section and a second memory section, and before an OTP memory block is programmed, each memory cell of the OTP memory block storing a first logic value, the method comprising:
    selecting a target memory block; and
    writing a to-be-written data to the target memory block, wherein if the to-be-written data corresponds to a predetermined value, program only the first memory section of the target memory block to store a first data, and if the to-be-written data does not correspond to the predetermined value, program the second memory sec tion of the target memory block according to the to-be-written data.

11. The method of claim 10, further comprising:
reading the target memory block; and
if the first memory section of the target memory block stores the first data, the predetermined value is outputted as the value stored in the target memory block, and if the first memory section of the target memory block stores a second data, the value stored in the second memory section of the target memory block is outputted as the value stored in the target memory block.

12. The method of claim 10, wherein the memory device comprises M OTP memory blocks, and the step of selecting the target memory block further comprises:
comparing the second memory sections of N OTP memory blocks from the M OTP memory blocks according to a search rule to select the target memory block.

13. The method of claim 12, wherein the search rule is a sequential search or a binary search.

* * * * *